(12) United States Patent
Bar et al.

(10) Patent No.: US 8,593,234 B2
(45) Date of Patent: Nov. 26, 2013

(54) BRAGG MIRROR AND BAW RESONATOR WITH A HIGH QUALITY FACTOR ON THE BRAGG MIRROR

(75) Inventors: Pierre Bar, Grenoble (FR); Sylvain Joblot, Valbonne (FR); David Petit, Fontaine (FR); Jean-Francois Carpentier, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 437 days.

(21) Appl. No.: 12/896,361

(22) Filed: Oct. 1, 2010

(65) Prior Publication Data

US 2011/0080232 A1 Apr. 7, 2011

(30) Foreign Application Priority Data

Oct. 1, 2009 (FR) ...................... 09 56858

(51) Int. Cl.
*H03H 9/15* (2006.01)
*H03H 9/05* (2006.01)
*H03H 9/54* (2006.01)

(52) U.S. Cl.
USPC ............................ 333/187; 333/189; 310/335

(58) Field of Classification Search
USPC .................. 333/187–189; 310/322, 334, 335
See application file for complete search history.

(56) References Cited

U.S. PATENT DOCUMENTS

| 4,158,805 | A | | 6/1979 | Ballato | |
|---|---|---|---|---|---|
| 5,821,833 | A | * | 10/1998 | Lakin | ............................ 333/187 |
| 5,864,261 | A | | 1/1999 | Weber | |
| 6,297,704 | B1 | | 10/2001 | Nicholls et al. | |
| 6,342,134 | B1 | | 1/2002 | Barber et al. | |
| 6,407,649 | B1 | | 6/2002 | Tikka et al. | |
| 6,998,940 | B2 | * | 2/2006 | Metzger | ......................... 333/187 |
| 7,230,509 | B2 | | 6/2007 | Stoemmer | |
| 7,235,915 | B2 | * | 6/2007 | Nakamura et al. | ............ 310/335 |

(Continued)

FOREIGN PATENT DOCUMENTS

| EP | 1489740 A2 | 12/2004 |
|---|---|---|
| FR | 2888663 B1 | 4/2008 |

(Continued)

OTHER PUBLICATIONS

L. Mai et al.; "Design and Fabrication of ZnO-Based FBAR Microwave Devices for Mobile WiMAX Applications"; IEEE Microwave and Wireless Components Letters, vol. 17, No. 12, Dec. 2007, pp. 867-869.*

(Continued)

*Primary Examiner* — Barbara Summons
(74) *Attorney, Agent, or Firm* — Seed IP Law Group PLLC

(57) ABSTRACT

A method for manufacturing a bulk acoustic wave resonator, each resonator including: above a substrate, a piezoelectric resonator, and next to the piezoelectric resonator, a contact pad connected to an electrode of the piezoelectric resonator; and, between the piezoelectric resonator and the substrate, a Bragg mirror including at least one conductive layer extending between the pad and the substrate and at least one upper silicon oxide layer extending between the pad and the substrate, the method including the steps of: depositing the upper silicon oxide layer; and decreasing the thickness unevenness of the upper silicon oxide layer due to the deposition method, so that this layer has a same thickness to within better than 2%, and preferably to within better than 1%, at the level of each pad.

19 Claims, 3 Drawing Sheets

(56) References Cited

U.S. PATENT DOCUMENTS

| | | | |
|---|---|---|---|
| 7,414,350 B1 * | 8/2008 | Barber et al. | 310/324 |
| 7,466,213 B2 * | 12/2008 | Lobl et al. | 333/187 |
| 7,586,390 B2 * | 9/2009 | Matsumoto et al. | 333/187 |
| 7,795,998 B2 * | 9/2010 | Mayer et al. | 333/187 |
| 7,966,722 B2 * | 6/2011 | Hart et al. | 29/847 |
| 2002/0123177 A1 | 9/2002 | Ruby et al. | |
| 2004/0113720 A1 | 6/2004 | Komuro et al. | |
| 2005/0023932 A1 | 2/2005 | Inoue et al. | |
| 2005/0057117 A1 | 3/2005 | Nakatsuka et al. | |
| 2005/0104690 A1 * | 5/2005 | Larson et al. | 333/191 |
| 2005/0110598 A1 | 5/2005 | Larson, III | |
| 2006/0119230 A1 * | 6/2006 | Umeda et al. | 310/358 |
| 2007/0279155 A1 * | 12/2007 | Uno et al. | 333/191 |
| 2009/0045703 A1 | 2/2009 | Barber et al. | |
| 2009/0045704 A1 * | 2/2009 | Barber et al. | 310/364 |
| 2009/0133237 A1 | 5/2009 | Onishi et al. | |
| 2010/0134210 A1 | 6/2010 | Umeda | |
| 2010/0148638 A1 | 6/2010 | Umeda | |
| 2011/0080233 A1 * | 4/2011 | Petit et al. | 333/187 |
| 2011/0227671 A1 | 9/2011 | Zhang | |

FOREIGN PATENT DOCUMENTS

| | | |
|---|---|---|
| JP | 2005311849 A | 11/2005 |
| JP | 2006229282 A | 8/2006 |
| JP | 2006325619 A | 12/2006 |

OTHER PUBLICATIONS

Kobayashi, H. et al., "Fabrication of Piezoelectric Thin Film Resonators with Acoustic Quarter-Wave Multilayers," Japanese Journal of Applied Physics, Japan Society of Applied Physics 41(5B) Part 1:3455-3457, May 2002.

Mourot L. et al., "Band Reject Filter in BAW Technology," Proceedings of the 38th European Microwave Conference, Amsterdam, The Netherlands, Oct. 27-31, 2008, pp. 349-352.

Petit, D. et al., "Thermally Stable Oscillator at 2.5 GHz Using Temperature Compensated BAW Resonator and its Integrated Temperature Sensor," IEEE International Ultrasonics Symposium Proceedings, Beijing, China, Nov. 2-5, 2008, pp. 895-898.

Dossou, S. et al., "60µW SMR BAW Oscillator Designed in 65nm CMOS Technology," IEEE International Symposium on Circuits and Systems, Seattle, Washington, May 18-21, 2008, pp. 1456-1459.

Petit, D. et al., "Temperature Compensated BAW Resonator and Its Integrated Thermistor for a 2.5GHz Electrical Thermally Compensated Oscillator," IEEE Radio Frequency Integrated Circuits Symposium, Boston, Massachusetts, Jun. 7-9, 2009, pp. 339-342.

Reinhardt, A. et al., "P1I-4 Simulation of BAW Resonators Frequency Adjustment," IEEE Ultrasonics Symposium, New York, New York, Oct. 28-31, 2007, pp. 1444-1447.

Petit, D. et al. "Method for Manufacturing BAW Resonators on a Semiconductor Wafer," U.S. Appl. No. 12/896,382, filed Oct. 1, 2010, 18 pages.

Bar, P. et al., "Method for Manufacturing Monolithic Oscillator with BAW Resonators," U.S. Appl. No. 12/896,394, filed Oct. 1, 2010, 16 pages.

Lakin et al., "Temperature Compensated Bulk Acoustic Thin Film Resonators," 2000 IEEE Ultrasonics Symposium, pp. 855-858, Oct. 2000.

Ohta et al., "Temperature Characteristics of Solidly Mounted Piezoelectric Thin Film Resonators," 2003 IEEE International Ultrasonics Symposium, Honolulu, HI, Oct. 5-8, 2003, vol. 2, pp. 2011-2015.

Ekeom et al., "Thermoelastic FEM-BEM Model for Solidly Mounted Resonator," 2008 IEEE International Ultrasonics Symposium, Beijing, China, Nov. 2-5, 2008, pp. 1564-1567.

* cited by examiner

BRAGG MIRROR AND BAW RESONATOR WITH A HIGH QUALITY FACTOR ON THE BRAGG MIRROR

BACKGROUND

1. Technical Field

The present disclosure relates to a bulk acoustic wave (BAW) resonator.

2. Description of the Related Art

A BAW resonator comprises a resonator core, or piezoelectric resonator, formed of two electrodes between which is arranged a layer of a piezoelectric material. When an electric field is applied to the piezoelectric layer by application of a potential difference between the electrodes, this creates a mechanical disturbance in the form of acoustic waves. Such waves propagate in the resonator. The fundamental resonance settles when the acoustic wavelength in the piezoelectric material substantially corresponds to twice the thickness of the piezoelectric layer.

A resonator especially comprises two notable frequencies:

the frequency at which the acoustic impedance of the resonator is the smallest, currently called the resonance frequency; and the frequency at which the acoustic impedance of the resonator is the largest, currently called antiresonance frequency.

BAW resonators are generally formed above a substrate, for example, on a silicon wafer. An acoustic isolation device is then provided between the resonator core and the substrate to avoid losing the acoustic waves in the substrate. There mainly exist two types of BAW resonators: suspended BAW resonators and BAW resonators mounted on a substrate.

Suspended BAW resonators, better known as FBARs (Film Bulk Acoustic Wave Resonators) or TFRs (Thin Film Resonators), comprise an isolating air layer between the resonator core and the substrate. There thus is a cavity in the substrate or a bridge above the substrate.

BAW resonators mounted on the substrate, better known as SMRs (Solidly Mounted Resonators), are isolated from the substrate by an acoustic reflector, currently called Bragg mirror. They have a stronger structure, better adapted to conventional manufacturing methods.

BAW resonators with a Bragg mirror are considered herein.

FIG. 1 is a cross-section view schematically showing a BAW resonator 1 with a Bragg mirror formed on a substrate 3. Although FIG. 1 shows a single resonator, in practice, many resonators are formed simultaneously on a same substrate wafer.

Resonator 1 comprises a piezoelectric resonator 5 formed of the stacking of a lower electrode 5a, of a layer 5b of a piezoelectric material, and of an upper electrode 5c.

An isolation structure 7, for example, a Bragg mirror, forms an interface between piezoelectric resonator 5 and substrate 3. A reflector 7 is an alternated stack of layers 7a of a material with a low acoustic impedance and of layers 7b of a material with a high acoustic impedance, each of these materials being indifferently isolating or conductive.

The thickness of each layer 7a, 7b is selected to be substantially equal to one quarter of the resonance acoustic wavelength in the material forming it. At the resonance frequency, the reflector 7 behaves as an acoustic mirror and sends the waves back to the resonator. The quality of the acoustic isolation increases along with the number of layers 7a, 7b of the alternated stack. In practice, reflectors with 4 or 5 layers are frequently used.

FIG. 2 is a top view schematically showing BAW resonator 1 of FIG. 1. Contact pads 13 and 14 are connected by conductive tracks 15 and 16, to lower and upper electrodes 5a and 5c of piezoelectric resonator 5. Conductive tracks 15 and 16 are schematically shown in FIG. 1 as an extension of electrodes 5a and 5c. Region 11, between pads 13 and 14 and tracks 15 and 16, and over substrate 3, is generally filled with silicon oxide.

The surface area taken up by contact pads 13 and 14 and by interconnect tracks 15 and 16 is, in practice, generally close to the active surface area of piezoelectric resonator 5.

A disadvantage of the structure described hereabove is that it has a low quality factor as compared with the theoretical quality factor of a BAW resonator with a Bragg mirror.

It is here desired to improve the quality factor, around the antiresonance frequency, of a BAW resonator intended to be used in an oscillator.

BRIEF SUMMARY

One embodiment of the present disclosure overcomes all or part of the disadvantages of BAW resonators with conventional Bragg mirrors.

One embodiment of the present disclosure is a BAW resonator with a Bragg mirror having a high quality factor around the antiresonance frequency.

One embodiment of the present disclosure is a resonator that is temperature-stable and is easy to manufacture. In one embodiment of the present disclosure, a device having a piezoelectric resonator on a substrate is provided. The piezoelectric resonator has a first electrode coupled to a first contact pad adjacent the piezoelectric resonator. The device includes a Bragg mirror between the substrate and the piezoelectric resonator, the Bragg mirror having a first dielectric layer on a first conductive layer, the first dielectric layer and the first conductive layer extending beneath the piezoelectric resonator and the first contact pad, and a second conductive layer between the first conductive layer and the first dielectric layer, the first dielectric layer having a top surface onto which the piezoelectric resonator and the first contact pad are formed.

One embodiment of the present disclosure provides a method for manufacturing a wafer on which are formed BAW resonators, each BAW resonator comprising: above a substrate, a piezoelectric resonator, and next to the piezoelectric resonator, at least one contact pad connected to an electrode of the piezoelectric resonator; and, between the piezoelectric resonator and the substrate, a Bragg mirror. The Bragg mirror comprises at least one conductive layer extending between the pad and the substrate and at least one upper silicon oxide layer extending between the pad and the substrate. The method comprises the successive steps of: a) depositing the upper silicon oxide layer; and b) decreasing an uneven thickness of the upper silicon oxide layer due to the deposition method so that this layer has a same thickness to within better than 2%, and preferably to within better than 1%, at the level of each pad.

According to an embodiment of the present disclosure, step b) further comprises decreasing the uneven thickness of the upper silicon oxide layer due to the deposition method, so that this layer has a same thickness to within better than 0.5%, and preferably to within better than 0.2%, at the level of each piezoelectric resonator.

According to an embodiment of the present disclosure, the unevenness of the upper silicon layer is reduced by ion etching.

According to an embodiment of the present disclosure, the conductive layer is made of tungsten.

According to an embodiment of the present disclosure, each BAW resonator comprises, superposed to the conductive layer, a layer of a material having an electric conductivity greater than that of the conductive layer.

According to an embodiment of the present disclosure, the material of electric conductivity greater than that of the conductive layer is aluminum.

According to an embodiment of the present disclosure, the piezoelectric resonator is formed by stacking of a lower electrode, of a layer of a piezoelectric material, and of an upper electrode.

Another embodiment of the present disclosure provides a wafer on which are formed BAW resonators, each BAW resonator comprising: above a substrate, a piezoelectric resonator, next to the piezoelectric resonator, at least one contact pad connected to an electrode of the piezoelectric resonator and, between the piezoelectric resonator and the substrate, a Bragg mirror. The Bragg mirror comprises at least one conductive layer extending between the pad and the substrate. Each BAW resonator comprises, superposed to the conductive layer, a layer of a material having an electric conductivity greater than that of the conductive layer and an acoustic impedance different from that of the conductive layer.

According to an embodiment of the present disclosure, the conductive layer is made of tungsten and the material having an electric conductivity greater than that of the conductive layer is aluminum.

The foregoing objects, features, and advantages of the present disclosure will be discussed in detail in the following non-limiting description of specific embodiments in connection with the accompanying drawings.

DETAILED DESCRIPTION

Figure 1:
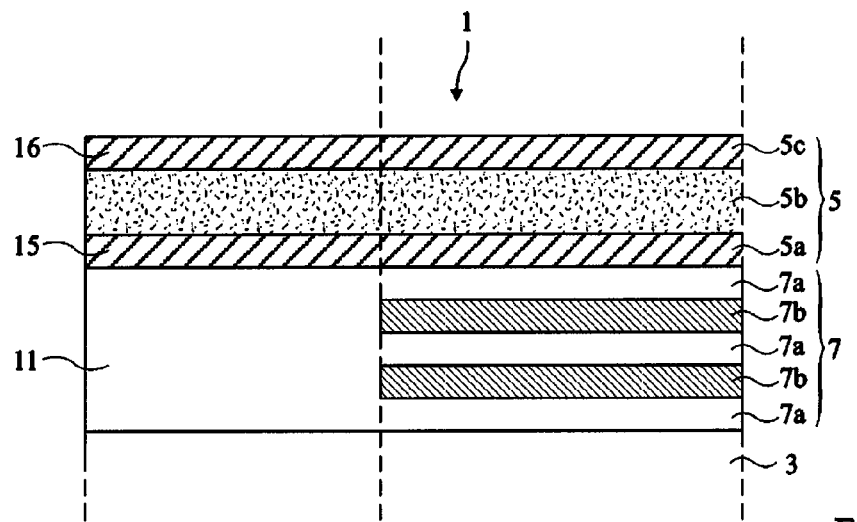
FIG. 1 is a known cross-section view schematically showing a BAW resonator with a Bragg mirror.
Figure 2:
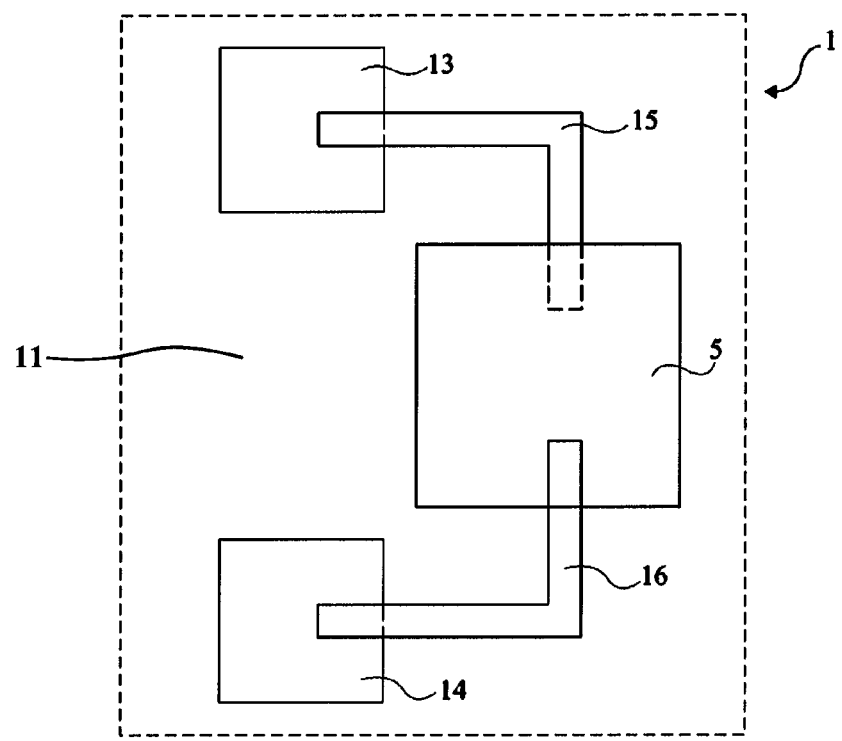
FIG. 2 is a simplified top view of the BAW resonator of FIG. 1.

For clarity, the same elements have been designated with the same reference numerals in the different drawings and, further, as usual in the representation of microcomponents, the various drawings are not to scale.

The present inventors have noticed the presence of a parasitic coupling between the contact pads, the interconnect tracks, and the substrate. This results in current leakages in the substrate. Such leakages have an influence upon the behavior of the BAW resonator and especially alter the quality factor.

Figure 3:
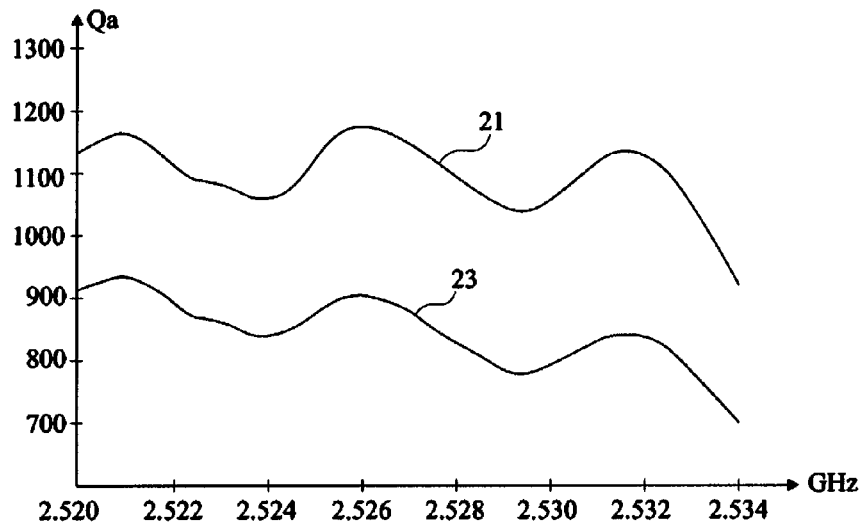
FIG. 3 illustrates the influence of the contact pads and of the interconnect tracks on the quality factor of a BAW resonator, around the antiresonance frequency.

FIG. 3 illustrates the influence of the contact pads and of the interconnect tracks on the quality factor of a BAW resonator, around the antiresonance frequency.

To study this influence, the present inventors have measured the electric characteristics of a reference device, comprising the pads and conductive tracks usually provided in a BAW resonator, but without the actual resonator.

By simulation, based on the measurement of the quality factor of a real BAW resonator, they have deduced the intrinsic quality factor of the BAW resonator, that is, the theoretical quality factor of a BAW resonator in which the influence of the pads and connection tracks is not considered.

Curve 21 shows the variation of the quality factor of a BAW resonator according to frequency, around the antiresonance frequency (on the order of 2.5 GHz in this example).

Curve 23 shows the variation of the effective quality factor of a BAW resonator according to frequency, around the antiresonance frequency.

It can be observed that the effective quality factor is much smaller than the intrinsic quality factor. In this example, the difference is on the order of 30%.

An aspect of an embodiment of the present disclosure is to provide an electrically conductive shield between the pads and connection tracks and the substrate, to minimize or suppress charge leakages in the substrate.

Figure 4:
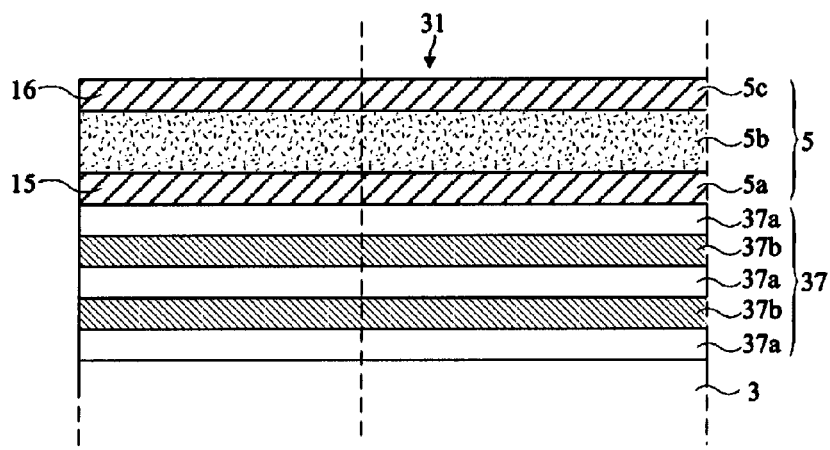
FIG. 4 is a cross-section view schematically showing an embodiment of a BAW resonator with a Bragg mirror.

FIG. 4 is a cross-section view schematically showing an embodiment of a BAW resonator 31.

As in the BAW resonator 1 of FIG. 1, a Bragg mirror 37 forms an interface between piezoelectric resonator 5 and substrate 3. Bragg mirror 37 is an alternated stack of layers 37a of a material having a low acoustic impedance and of layers 37b of a material having a high acoustic impedance.

A Bragg mirror in which at least one of the two materials is electrically conductive is selected. In this example, layers 37a are made of silicon oxide and layers 37b are made of tungsten.

Unlike resonator 1 of FIG. 1, resonator 31 has its layers extending under interconnect tracks 15 and 16 and under the contact pads.

Since tungsten has a high electric conductivity with respect to substrate 3, parasitic currents, due to phenomena of capacitive coupling with the pads and connections pads, no longer cross the substrate, but rather layers 37b.

Figure 5:
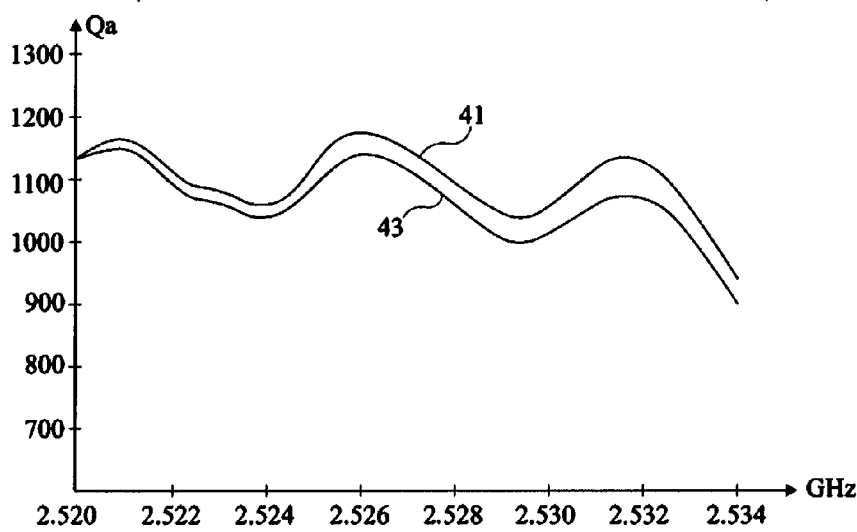
FIG. 5 illustrates the influence of the contact pads on the quality factor of the BAW resonator of FIG. 4, around the antiresonance frequency.

FIG. 5 illustrates the influence of the conductive pads and of the interconnect tracks on the quality factor of a BAW resonator of the type described in relation with FIG. 4, around the antiresonance frequency.

Curve 41 shows the variation of the intrinsic quality factor of the BAW resonator according to frequency, around the antiresonance frequency.

Curve 43 shows the variation of the real quality factor of the BAW resonator according to frequency, around the antiresonance frequency.

It can be observed that the difference between the real quality factor and the intrinsic quality factor is very small. In this example, it is on the order of 2% around the antiresonance frequency.

However, the present inventors have found that the extension of the conductive layers of the Bragg mirror under the contact pads has an unwanted consequence. Although this extension protects the substrate from current leakages, it strongly increases the value of the stray capacitances linked to the contact pads. Such capacitances especially have an influence upon the impedance of the resonator and upon its temperature behavior. A shift in the antiresonance frequency, on the order of from 1 to 10 per 1,000, linked to the extension of the conductive layers of the Bragg mirror, can be observed.

The actual frequency shift is not a problem, provided for it to be known. However, the present inventors have found that this shift varies among BAW resonators made from a same substrate wafer, and even more if the resonators originate from different wafers. Further, the temperature-sensitivity of this shift varies from one resonator to the other, at the scale of a wafer.

By analyzing the causes of such inaccuracies, the present inventors have noted that, among the different layers forming a BAW resonator, the silicon oxide layers are those with the most inaccurate deposition. As an example, thickness variations having an amplitude on the order of 9% (that is, a standard deviation on the order of 2%), can be observed on these layers at the scale of a substrate wafer. Such thickness variations have a strong influence on the value of the stray capacitances linked to the contact pads, as well as on the temperature behavior of these capacitances.

An aspect of an embodiment of the present disclosure is to provide, during the manufacturing, a step of uniformizing the thickness of the upper silicon oxide layer so that this layer has, between the pads and connection tracks and the substrate, a thickness which is constant to within better than 2% (or with a 0.5% standard deviation), and preferably to within better than 1% (or with a 0.2% standard deviation), at the level of each resonator originating from a same wafer or from different wafers.

According to an alternative embodiment, it is also provided to uniformize the thickness of this upper silicon oxide layer between piezoelectric resonator 5 and Bragg mirror 37, to optimize the temperature behavior of the resonator.

Figure 6:
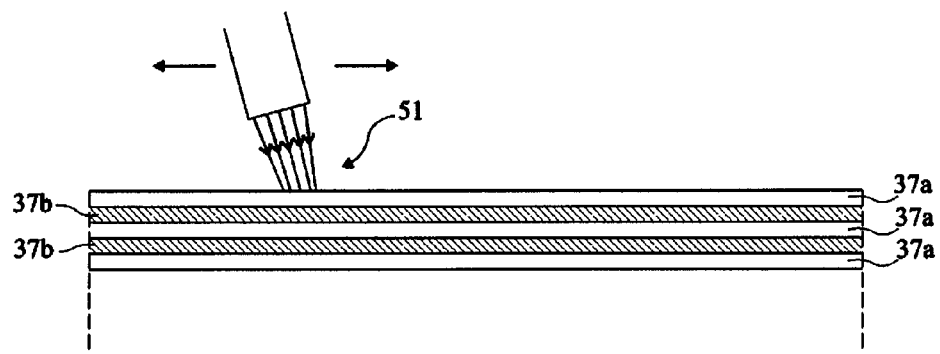
FIG. 6 illustrates a step of an example of a method for forming BAW resonators with a Bragg mirror.

FIG. 6 illustrates a step of an example of a method for forming BAW resonators of the type described in relation with FIG. 4. FIG. 6 is a cross-section view schematically showing a portion of a substrate wafer on which are formed elements 37a, 37b of the Bragg mirror. Layers 37a are silicon oxide layers and layers 37b are tungsten layers. The upper layer of the Bragg mirror is a silicon oxide layer.

After the deposition of the upper silicon oxide layer, a step of uniformization of the thickness of this layer by etching of the overthicknesses due to the deposition method is provided. This thickness uniformization step may advantageously be carried out by ion etching.

Indeed, during the manufacturing of BAW resonators, a step of final frequency adjustment by ion etching of a layer covering the piezoelectric resonator (for example, a silicon nitride or silicon oxide layer) is provided. The ion etching means are thus already available.

As an example, the substrate wafer on which the resonators are formed is scanned by a beam 51 of etch ions of significant mass. The scan speed is controlled to stay longer on the areas to be etched than on the others. At the end of the uniformization step, upper layer 37a has a same thickness to within better than 2%, and preferably to within better than 1%, at the level of each region intended to support pads and electric connection tracks of a resonator, or at the level of each resonator.

Due to this uniformization step, the frequency shift due to the stray capacitances of the contact pads is substantially the same for all resonators formed from a same substrate wafer. Further, the temperature behavior of this shift is substantially constant at the scale of a substrate wafer.

Figure 7:
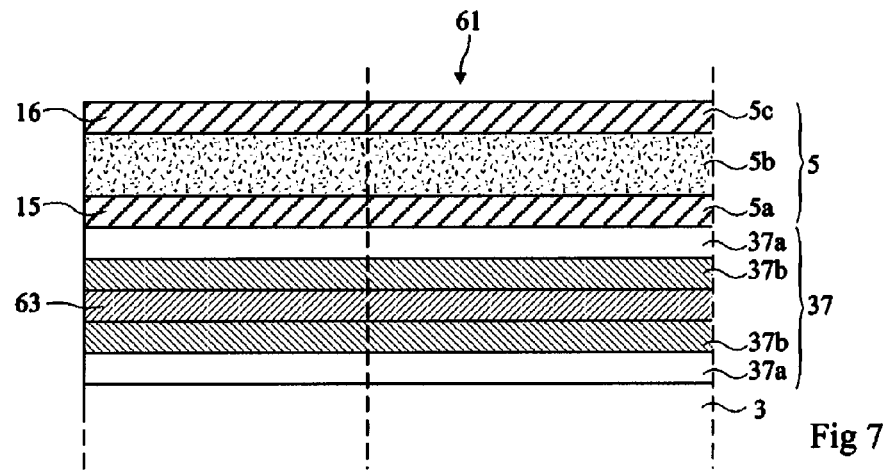
FIG. 7 is a cross-section view schematically showing an alternative embodiment of the BAW resonator described in relation with FIG. 4.

FIG. 7 is a cross-section view schematically showing an alternative embodiment of a BAW resonator 61. Unlike resonator 31 of FIG. 4, resonator 61 comprises, under the tungsten layer 37b closest to piezoelectric resonator 5, a layer 63 of a material having an electric conductivity greater than that of tungsten, for example, aluminum. As an example, the thickness of the aluminum layer may be on the order of from 500 to 700 nm, and the thickness of the tungsten layer may be on the order of from 500 to 800 nm for an antiresonance frequency on the order of 2.5 GHz. In this example, intermediary oxide layer 37a is replaced with aluminum layer 63.

An aspect of an embodiment of the present disclosure comprises improving the electric conductivity of at least one layer of the Bragg mirror extending between the pads and electric connection tracks and the substrate by providing, in contact with this layer, a layer of a material having a very high electric conductivity, for example, aluminum or copper. The material and the thickness of this conductive layer will be selected so as not to or only slightly alter the acoustic performances of the resonator.

The provision of such a layer has the advantage of strongly improving the quality factor of the BAW resonator. In the case where a great accuracy of the resonance frequency would not be indispensable, the above-mentioned step of uniformization of the thickness of the upper silicon oxide layer may be omitted, to only provide highly-conductive layer 63 in order to obtain a high quality factor.

Figure 8:
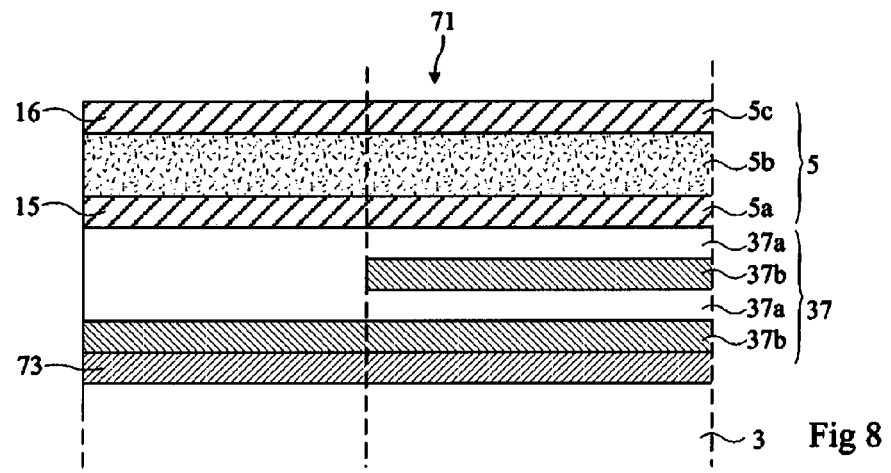
FIG. 8 is a cross-section view schematically showing another alternative embodiment of the BAW resonator described in relation with FIG. 4.

FIG. 8 is a cross-section view schematically showing an alternative embodiment of BAW resonator 71. Unlike resonator 31 of FIG. 4, resonator 71 comprises, under the tungsten layer 37b closest to substrate 3, a layer 73 of a material having an electric conductivity greater than that of tungsten, for example, aluminum. Further, upper tungsten layer 37b of the Bragg mirror present between layer 73 and the piezoelectric resonator does not extend under the pads and connection tracks. The region between lower tungsten layer 37b and pads and connection tracks 15 is formed of silicon oxide. This embodiment cumulates the advantages of decreasing the parasitic couplings linked to the presence of the pads and interconnect tracks, of optimizing the acoustic reflection, and of increasing the quality factor of the resonator.

According to an advantage of the above-described embodiments, the present disclosure may be implemented by using standard manufacturing methods.

Specific embodiments of the present disclosure have been described. Various alterations and modifications will occur to those skilled in the art. In particular, the present disclosure is not limited to the method of uniformization of the thickness of the upper silicon oxide layer by ion etching as described hereabove. It will be within the abilities of those skilled in the art to use any other adapted method.

Further, the present disclosure is not limited to the use of a Bragg mirror comprising tungsten layers. Any other Bragg mirror comprising at least one conductive material may be used. It should however be noted that Bragg mirrors formed of an alternation of silicon oxide layers and of tungsten layers have good reflecting properties due to the high contrast between the acoustic impedances of these two materials.

Such alterations, modifications, and improvements are intended to be part of this disclosure, and are intended to be within the spirit and the scope. Accordingly, the foregoing description is by way of example only and is not intended to be limiting. The present disclosure is limited only as defined in the following claims and the equivalents thereto.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A Bragg mirror, comprising:
   a first conductive layer;
   a first dielectric layer on the first conductive layer;
   a second conductive layer between a substrate and the first conductive layer and electrically connected to the first conductive layer, the second conductive layer having an electric conductivity greater than that of the first conductive layer and an acoustic impedance different from that of the first conductive layer.

2. The Bragg mirror of claim 1 wherein the first conductive layer is tungsten and the second conductive layer is aluminum.

3. The Bragg mirror of claim 1 wherein the first dielectric layer includes silicon dioxide.

4. The Bragg mirror of claim 1, further comprising:
   a second dielectric layer, and
   a third conductive layer on the second dielectric layer, the second conductive layer being on the third conductive layer.

5. The Bragg mirror of claim 1, further comprising a second dielectric layer and a third conductive layer on the second dielectric layer, wherein the third conductive layer and the second dielectric layer separate the first dielectric layer from the first conductive layer.

6. The Bragg mirror of claim 1 wherein the first dielectric layer has a thickness variation of less than 2%.

7. A bulk acoustic wave resonator, comprising:
   a substrate;
   a Bragg mirror on the substrate, the Bragg mirror having a first conductive layer on the substrate and a first dielectric layer on the first conductive layer;
   a piezoelectric resonator on the first dielectric layer, the piezoelectric resonator having a first electrode;
   a first contact pad adjacent the piezoelectric resonator on the first dielectric layer, the first contact pad coupled to the first electrode of the piezoelectric resonator; and
   a second conductive layer between the substrate and the first conductive layer and electrically connected to the first conductive layer, the second conductive layer having an electric conductivity greater than that of the first conductive layer and an acoustic impedance different from that of the first conductive layer, wherein the first conductive layer and the second conductive layer extend from a first region that is between the first contact pad and the substrate to a second region that is between the piezoelectric resonator and the substrate.

8. The bulk acoustic wave resonator of claim 7 wherein the first conductive layer is tungsten and the second conductive layer is aluminum.

9. The bulk acoustic wave resonator of claim 7 wherein the piezoelectric resonator includes a piezoelectric layer on the first electrode and a second electrode on the piezoelectric layer, the bulk acoustic wave resonator including a second contact pad positioned adjacent the piezoelectric resonator and coupled to the second electrode.

10. The bulk acoustic wave resonator of claim 9 wherein the first dielectric layer includes silicon dioxide.

11. The bulk acoustic wave resonator of claim 7, further comprising:
    a second dielectric layer on the substrate, and
    a third conductive layer on the second dielectric layer, the second conductive layer being on the third conductive layer.

12. The bulk acoustic wave resonator of claim 7, further comprising a second dielectric layer and a third conductive layer on the second dielectric layer, wherein the third conductive layer and the second dielectric layer separate the first dielectric layer from the first conductive layer.

13. The bulk acoustic wave resonator of claim 7 wherein the first dielectric layer has a thickness variation of less than 2%.

14. A bulk acoustic wave resonator, comprising:
    a substrate;
    a Bragg mirror on the substrate, the Bragg mirror having a first conductive layer on the substrate and a first dielectric layer on the first conductive layer;
    a piezoelectric resonator on the first dielectric layer, the piezoelectric resonator having a first electrode;
    a first contact pad adjacent the piezoelectric resonator on the first dielectric layer, the first contact pad being coupled to the first electrode of the piezoelectric resonator; and
    a second conductive layer between the substrate and the first conductive layer, the second conductive layer having an electric conductivity greater than that of the first conductive layer and an acoustic impedance different from that of the first conductive layer, wherein the first conductive layer and the second conductive layer extend from a first region that is between the first contact pad and the substrate to a second region that is between the piezoelectric resonator and the substrate, wherein the first conductive layer is tungsten and the second conductive layer is aluminum.

15. The bulk acoustic wave resonator of claim 14 wherein the piezoelectric resonator includes a piezoelectric layer on the first electrode and a second electrode on the piezoelectric layer; a second contact pad positioned adjacent the piezoelectric resonator and coupled to the second electrode.

16. The bulk acoustic wave resonator of claim 15 wherein the first dielectric layer includes silicon dioxide.

17. The bulk acoustic wave resonator of claim 14, further comprising a second dielectric layer on the substrate, a third conductive layer on the second dielectric layer, and the second conductive layer on the third conductive layer.

18. The bulk acoustic wave resonator of claim 14, further comprising a third conductive layer on a second dielectric layer, wherein the third conductive layer and the second dielectric layer separate the first dielectric layer from the first conductive layer.

19. The bulk acoustic wave resonator of claim 14 wherein the first dielectric layer has a thickness variation of less than 2%.

* * * * *